United States Patent
He

(10) Patent No.: US 9,401,603 B2
(45) Date of Patent: Jul. 26, 2016

(54) PROTECTION CIRCUIT AND INPUT CIRCUIT SUITABLE FOR INTEGRATED CIRCUIT

(71) Applicant: MACRONIX International Co., Ltd., Hsinchu (TW)

(72) Inventor: Chieh-Wei He, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 62 days.

(21) Appl. No.: 14/561,681

(22) Filed: Dec. 5, 2014

(65) Prior Publication Data

US 2016/0164277 A1 Jun. 9, 2016

(51) Int. Cl.
*H02H 9/04* (2006.01)
*H01L 23/60* (2006.01)
*H01L 27/02* (2006.01)

(52) U.S. Cl.
CPC .............. *H02H 9/046* (2013.01); *H01L 23/60* (2013.01); *H01L 27/0248* (2013.01); *H01L 27/0266* (2013.01)

(58) Field of Classification Search
CPC .......... H02H 9/04–9/046; H01L 23/60; H01L 23/62; H01L 27/0248; H01L 27/0266
USPC .......................................................... 361/56
See application file for complete search history.

(56) References Cited

U.S. PATENT DOCUMENTS

| | | | | |
|---|---|---|---|---|
| 5,615,073 | A * | 3/1997 | Fried | H01L 27/0251 361/111 |
| 5,815,354 | A * | 9/1998 | Braceras | H02H 9/046 361/111 |
| 6,249,410 | B1 * | 6/2001 | Ker | H01L 27/0251 361/111 |
| 6,256,184 | B1 * | 7/2001 | Gauthier, Jr. | H01L 27/0266 361/111 |
| 7,978,454 | B1 * | 7/2011 | Pasqualini | H02H 9/046 361/111 |
| 2010/0271742 | A1 * | 10/2010 | Shannon | G01R 31/002 361/56 |
| 2011/0176245 | A1 * | 7/2011 | Worley | H03F 1/52 361/56 |
| 2013/0114172 | A1 * | 5/2013 | Huang | H02H 9/046 361/56 |
| 2014/0376134 | A1 * | 12/2014 | Hunter | H02H 9/046 361/56 |
| 2015/0311700 | A1 * | 10/2015 | Lee | H02H 9/04 361/56 |

\* cited by examiner

*Primary Examiner* — Stephen W Jackson
*Assistant Examiner* — Christopher Clark
(74) *Attorney, Agent, or Firm* — J.C. Patents

(57) ABSTRACT

An input circuit suitable for an integrated circuit (IC) and a protection circuit in the input circuit are provided. The protection circuit includes a transistor, a voltage selector, an inverter, a resistor and a switch circuit. The transistor is coupled to an input end of the protection circuit. The voltage selector is coupled to the transistor and the input end of the protection circuit, and outputs a lower one of a voltage at the input end of the protection circuit and a ground voltage to the transistor. The inverter is coupled to the transistor. The resistor is coupled between a power supply voltage and the inverter. The switch circuit is coupled to the inverter, a preset voltage and an output end of the protection circuit and is controlled by the inverter to connect the preset voltage to the output end or to switch the output end to a floating state.

10 Claims, 3 Drawing Sheets

PROTECTION CIRCUIT AND INPUT CIRCUIT SUITABLE FOR INTEGRATED CIRCUIT

FIELD OF THE DISCLOSURE

The invention relates to a protection circuit and an input circuit, and particularly relates to a protection circuit and an input circuit suitable for an integrated circuit (IC).

DESCRIPTION OF RELATED ART

All the ICs have to pass some tests before leaving the factory. For example, within the latch-up test, positive voltage, positive current and negative current are respectively supplied to the bonding pad of the IC, where the negative current is supplied by extracting the current from the ground end in the IC through the bonding pad. At this time, the voltage at the bonding pad is a negative voltage lower than the ground voltage.

In the IC, some internal circuits would be affected by the external negative voltage. When the negative current test is performed on the bonding pad corresponding to such an internal circuit, the negative voltage enters the internal circuit, so as to disturb the signal or the operation in the IC, and result in malfunction in the circuit.

SUMMARY OF THE DISCLOSURE

The present invention provides a protection circuit and an input circuit, which are capable of preventing the negative voltage from entering the IC through the bonding pad.

A protection circuit of the present invention includes a transistor, a voltage selector, an inverter, a resistor and a switch circuit. The transistor is coupled to an input end of the protection circuit. The voltage selector is coupled to the transistor and the input end of the protection circuit, and outputs a lower one of a voltage at the input end of the protection circuit and a ground voltage to the transistor. The inverter is coupled to the transistor. The resistor is coupled between a power supply voltage and the inverter. The switch circuit is coupled to the inverter, a preset voltage and an output end of the protection circuit and controlled by the inverter to connect the preset voltage to the output end of the protection circuit or to switch the output end of the protection circuit to a floating state.

An input circuit of the present invention is adapted to an IC. The input circuit includes a diode, a resistor, a first protection circuit and a second protection circuit. An anode of the diode is coupled to a bonding pad of the IC. A cathode of the diode is coupled to the power supply voltage. The first protection circuit is coupled between the bonding pad and a ground end of the IC, so as to provide electrostatic discharge (ESD) protection. The resistor is coupled between the bonding pad and an internal circuit of the IC. An input end of the second protection circuit is coupled to the bonding pad. An output end of the second protection circuit is coupled between the resistor and the internal circuit. When a voltage at the input end is lower than 0, the second protection circuit boosts the output end to a preset voltage. When the voltage at the input end is higher than or equal to 0, the second protection circuit switches the output end to a floating state.

As described above, the output end of the second protection circuit is coupled to the internal circuit of the IC. When the voltage at the input end is lower than 0, the second protection circuit boosts the output end to the preset voltage, so as to avoid the malfunction caused by the negative voltage which enters the internal circuit.

It is to be understood that both the foregoing general description and the following detailed description are exemplary, and are not intended to limit the scope of the invention. To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
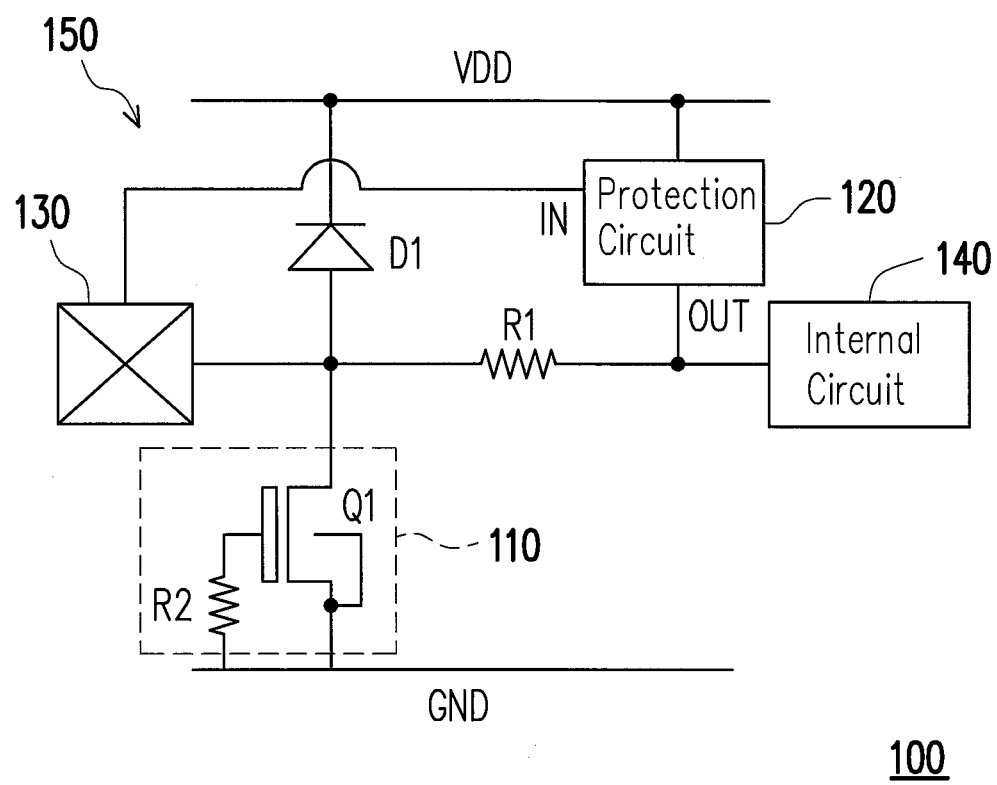
FIG. 1 is a schematic view of an input circuit of an integrated circuit according to an embodiment of the present invention.

FIG. 1 is a schematic view of an input circuit 150 of an integrated circuit (IC) 100 according to an embodiment of the present invention. The input circuit 150 includes a diode D1, a resistor R1 and protection circuits 110, 120. An anode of the diode D1 is coupled to a bonding pad 130 of the IC 100. A cathode of the diode D1 is coupled to a power supply voltage VDD. The resistor R1 is coupled between the bonding pad 130 and an internal circuit 140 of the IC 100. The protection circuit 110 is coupled between the bonding pad 130 and a ground end GND of the IC, so as to provide an electrostatic discharge (ESD) protection. When the negative current test is performed, the current is extracted from the ground end GND through the bonding pad 130 and the protection circuit 110.

An input end IN of the protection circuit 120 is coupled to the bonding pad 130, so a voltage at the input end IN is equal to a voltage at the bonding pad 130. An output end OUT of the protection circuit 120 is coupled between the resistor R1 and the internal circuit 140. When the voltage at the bonding pad 130 is higher than or equal to 0, the voltage at the input end IN of the protection circuit 120 is also higher than or equal to 0, and the protection circuit 120 switches the output end OUT to a floating state. As a result, the protection circuit 120 is unable to disturb the transmission of the foreign signal from the bonding pad 130 to the internal circuit 140 under the normal operation. When the voltage at the bonding pad 130 is lower than 0, the voltage at the input end IN of the protection circuit 120 is also lower than 0, and the protection circuit 120 boosts the output end OUT to a preset voltage higher than or equal to 0, such as 0 or power supply voltage VDD. As the result, the negative voltage at the bonding pad 130 is prevented from entering the internal circuit 140.

The protection circuit 110 includes a transistor Q1 and a resistor R2. The transistor Q1 is an N-channel metal-oxide-semiconductor field-effect (NMOS) transistor. A drain of the transistor Q1 is coupled to the bonding pad 130. A body and a source of the transistor Q1 are coupled to the ground end GND. A resistor R2 is coupled between a gate of the transistor Q1 and the ground end GND.

Figure 2:
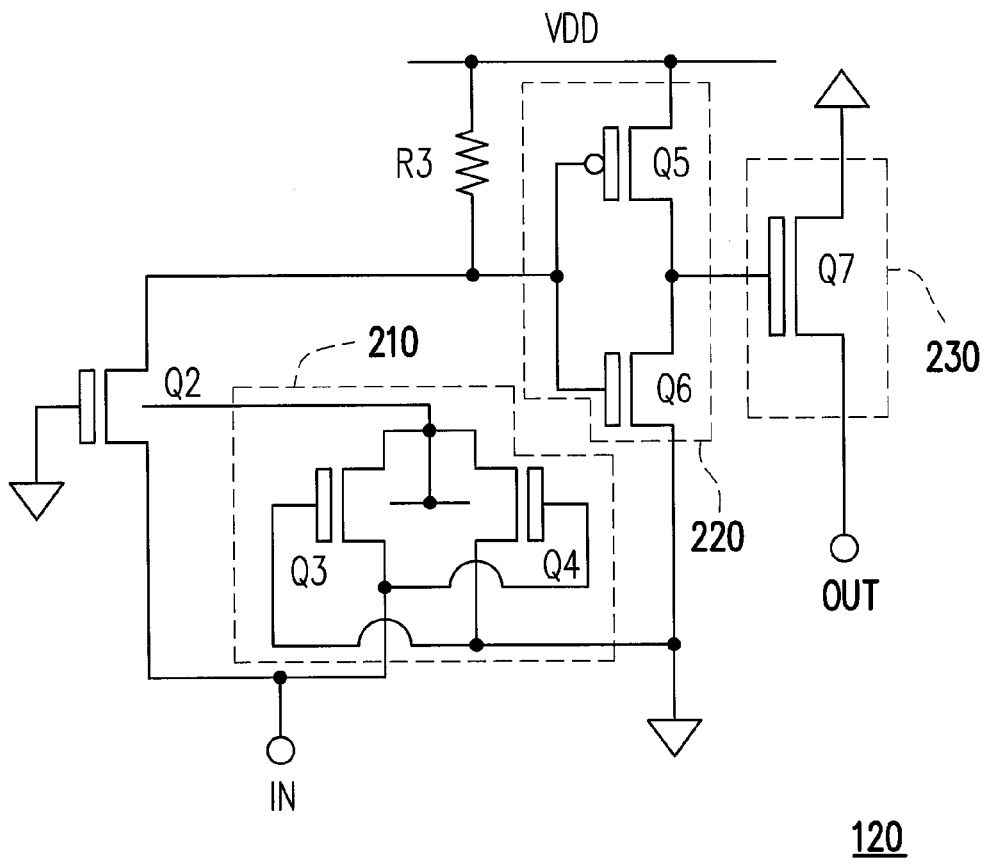
FIG. 2 is a schematic view of a protection circuit according to an embodiment of the present invention.

FIG. 2 is a schematic view of a protection circuit 120 according to an embodiment of the present invention. The protection circuit 120 includes a transistor Q2, a resistor R3, a voltage selector 210, an inverter 220 and a switch circuit 230. The transistor Q2 is an NMOS transistor. The source of the transistor Q2 is coupled to the input end IN of the protection circuit 120. The gate of the transistor Q2 is grounded. The body of the transistor Q2 receives the output voltage of the voltage selector 210. The drain of the transistor Q2 is coupled to the inverter 220. The voltage selector 210 is coupled to the body of the transistor Q2 and the input end IN of the protection circuit 120. The voltage selector 210 outputs a lower one of the voltage at the input end IN of the protection circuit 120 and the ground voltage to the body of the transistor Q2. Therefore, the body voltage of the transistor Q2 would not be higher than the source voltage of the transistor Q2, so as to avoid the wrong conduction occurred at the transistor Q2.

The voltage selector 210 includes transistors Q3 and Q4. Both the transistors Q3 and Q4 are NMOS transistors. The source of the transistor Q3 is coupled to the input end IN of the protection circuit 120. The gate of the transistor Q3 is grounded. The body and a drain of the transistor Q3 is coupled to the body of the transistor Q2. The source of the transistor Q4 is grounded. The gate of the transistor Q4 is coupled to the input end of the protection circuit 120. The body and a drain of the transistor Q4 is coupled to the body of the transistor Q2.

When the voltage at the input end IN is higher than the ground voltage, the transistor Q3 is turned off, and the transistor Q4 is turned on. A ground voltage is outputted to the body of the transistor Q2 by the transistor Q4. When the voltage at the input end IN is lower than the ground voltage, the transistor Q3 is turned on, and the transistor Q4 is turned off. The voltage at the input end IN is outputted to the body of the transistor Q2 by the transistor Q3.

The inverter 220 is coupled to the drain of the transistor Q2. The inverter 220 includes transistors Q5 and Q6, where the transistor Q5 is a P-channel metal-oxide-semiconductor field-effect (PMOS) transistor, and the transistor Q6 is an NMOS transistor. The resistor R3 is coupled between the power supply voltage VDD and the inverter 220. In the present embodiment, the preset voltage is the ground voltage. The switch circuit 230 is coupled to the inverter 220, the ground voltage and the output end OUT of the protection circuit 120. The switch circuit 230 is controlled by the inverter 220 to connect the output end OUT of the protection circuit 120 to the ground voltage, or controlled by the inverter 220 to switch the output end OUT of the protection circuit 120 to a floating state.

The switch circuit 230 includes a transistor Q7. The transistor Q7 is an NMOS transistor. The gate of the transistor Q7 is coupled to the inverter 220. The drain of the transistor Q7 is coupled to the output end OUT of the protection circuit 120. The source of the transistor Q7 is grounded.

When the voltage at the bonding pad 130 is lower than 0, the voltage at the input end IN of the protection circuit 120 is also lower than 0. The transistor Q2 is turned on due to the negative voltage, so as to transmit the negative voltage to the inverter 220. The transistor Q5 of the inverter 220 is turned on due to the negative voltage, such that the inverter 220 outputs the high voltage VDD. Then, the transistor Q7 is turned on due to the high voltage, so as to boost the output end OUT to the ground voltage and to prevent the negative voltage at the bonding pad 130 from entering the internal circuit 140.

When the voltage at the bonding pad 130 is higher than or equal to 0, the voltage at the input end IN of the protection circuit 120 is also higher than or equal to 0. Thus, the transistor Q2 is turned off. The power supply voltage VDD is transmitted to the inverter 220 by the resistor R3, such that the transistor Q6 of the inverter 220 is turned on to output the ground voltage. Then, the transistor Q7 is turned off due to the ground voltage, and the output end OUT of the protection circuit 120 is switched to the floating state. As the result, the signal transmission between the bonding pad 130 and the internal circuit 140 would not be disturbed.

Figure 3:
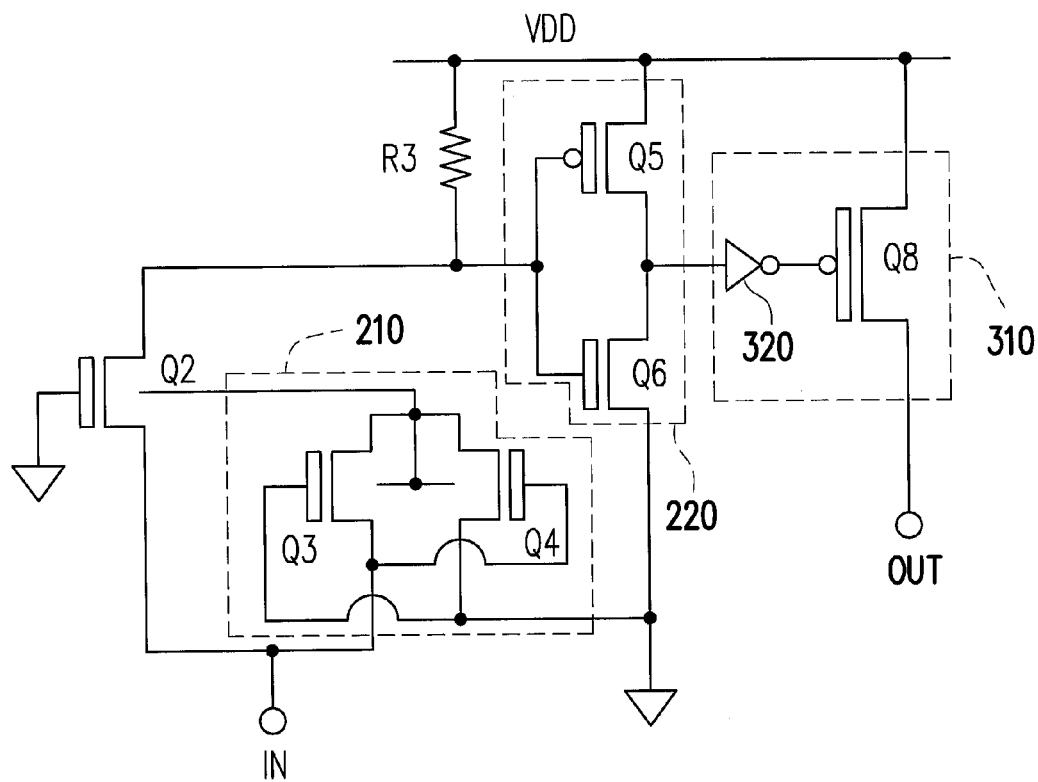
FIG. 3 is a schematic view of a protection circuit according to another embodiment of the present invention.

FIG. 3 is a schematic view of a protection circuit according to another embodiment of the present invention. In the protection circuit 120 of the present invention, the switch circuit 310 is configured instead of the switch circuit 230. The switch circuit 310 includes an inverter 320 and a transistor Q8. The inverter 320 is coupled to the inverter 220. The transistor Q8 is a PMOS transistor. The gate of the transistor Q8 is coupled to the inverter 320. The drain of the transistor Q8 is coupled to the output end OUT of the protection circuit 120. In the present embodiment, the preset voltage is the power supply voltage VDD. The source of the transistor Q8 is coupled to the power supply voltage VDD.

The function of the switch circuit 310 is similar to the function of the switch circuit 230. When the voltage at the input end IN of the protection circuit is lower than 0, the inverter 220 outputs the power supply voltage VDD, such that the transistor Q8 is turned on to boost the output end OUT of the protection circuit 120 to the power supply voltage VDD, so as to prevent the negative voltage at the bonding pad 130 from entering the internal circuit 140. When the voltage at the input end IN of the protection circuit 120 is higher than or equal to 0, the inverter 220 outputs the ground voltage, such that the transistor Q8 is turned off. The output end OUT of the protection circuit 120 is thus switched to the floating state. As the result, the signal transmission between the bonding pad 130 and the internal circuit 140 would not be disturbed.

Based on the previous description, the protection circuit provided by the present invention is configured to prevent the negative voltage from entering the internal circuit of the IC. However, the protection circuit provided in the present invention is irrelevant to the internal circuit of the IC. Therefore, the protection circuit can be used in collaboration with various internal circuits regardless of the details of those internal circuits. The protection circuit provided by the present invention can be implemented with NMOS transistors and PMOS transistors in small sizes, and therefore only a small layout area is required. Under normal operation, the protection circuit provided by the present invention would not disturb the external signal entering the internal circuit, and the protection circuit would not interfere with the original ESD protection circuit as well.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:
1. A protection circuit, comprising:
a first transistor, coupled to an input end of the protection circuit;
a voltage selector, coupled to the first transistor and the input end of the protection circuit, and outputting a lower one of a voltage at the input end of the protection circuit and a ground voltage to the first transistor;
a first inverter, coupled to the first transistor;
a resistor, coupled between a power supply voltage and the first inverter; and a switch circuit, coupled to the first inverter, a preset voltage and an output end of the protection circuit, and controlled by the first inverter to connect the preset voltage to the output end of the protection circuit or to switch the output end of the protection circuit to a floating state.

2. The protection circuit as claimed in claim 1, wherein the first transistor is an N-channel metal-oxide-semiconductor field-effect (NMOS) transistor, a source of the first transistor is coupled to the input end of the protection circuit, a gate of the first transistor is grounded, a body of the first transistor receives the output voltage of the voltage selector, and a drain of the first transistor is coupled to the first inverter.

3. The protection circuit as claimed in claim 1, wherein the voltage selector comprises:
   a second transistor, wherein the second transistor is an NMOS transistor, a source of the second transistor is coupled to the input end of the protection circuit, a gate of the second transistor is grounded and a body and a drain of the second transistor are coupled to the first transistor; and
   a third transistor, wherein the third transistor is an NMOS transistor, a source of the third transistor is grounded, a gate of the third transistor is coupled to the input end of the protection circuit and a body and a drain of the third transistor is coupled to the first transistor.

4. The protection circuit as claimed in claim 1, wherein the switch circuit comprises a fourth transistor, the fourth transistor is an NMOS transistor, a gate of the fourth transistor is coupled to the first inverter, a drain of the fourth transistor is coupled to the output end of the protection circuit, a source of the fourth transistor is grounded and the preset voltage is the ground voltage.

5. The protection circuit as claimed in claim 1, wherein the switch circuit comprises:
   a second inverter, coupled to the first inverter; and
   a fifth transistor, wherein the fifth transistor is a P-channel metal-oxide-semiconductor field-effect (PMOS) transistor, a gate of the fifth transistor is coupled to the second inverter, a drain of the fifth transistor is coupled to the output end of the protection circuit, a source of the fifth transistor is coupled to the power supply voltage and the preset voltage is the power supply voltage.

6. An input circuit, adapted to an integrated circuit (IC), the input circuit comprising:
   a diode, wherein an anode of the diode is coupled to a bonding pad of the IC and a cathode of the diode is coupled to a power supply voltage;
   a first protection circuit, coupled between the bonding pad and a ground end of the IC, and providing electrostatic discharge (ESD) protection;
   a first resistor, coupled between the bonding pad and an internal circuit of the IC; and
   a second protection circuit, wherein an input end of the second protection circuit is coupled to the bonding pad, an output end of the second protection circuit is coupled between the first resistor and the internal circuit, the second protection circuit boosts the output end to a preset voltage when a voltage at the input end is lower than 0, and the second protection circuit switches the output end to a floating state when the voltage at the input end is higher than or equal to 0.

7. The input circuit as claimed in claim 6, wherein the first protection circuit comprises:
   a first transistor, wherein the first transistor is an NMOS transistor, a drain of the first transistor is coupled to the bonding pad, and a body and a source of the first transistor is coupled to the ground end; and
   a second resistor, coupled between a gate of the first transistor and the ground end.

8. The input circuit as claimed in claim 6, wherein the second protection circuit comprises:
   a second transistor, coupled to the input end of the second protection circuit;
   a voltage selector, coupled to the second transistor and the input end of the second protection circuit, and outputting a lower one of a voltage at the input end of the second protection circuit and a ground voltage to the second transistor;
   a first inverter, coupled to the second transistor;
   a third resistor, coupled between the power supply voltage and the first inverter; and
   a switch circuit, coupled to the first inverter, the preset voltage and the output end of the second protection circuit, and controlled by the first inverter to connect the preset voltage and the output end or to switch the output end to the floating state.

9. The input circuit as claimed in claim 8, wherein the second transistor is an NMOS transistor, a source of the second transistor is coupled to the input end of the second protection circuit, a gate of the second transistor is grounded, a body of the second transistor receives the output voltage of the voltage selector, and a drain of the second transistor is coupled to the first inverter.

10. The input circuit as claimed in claim 8, wherein the voltage selector comprises:
    a third transistor, wherein the third transistor is an NMOS transistor, a source of the third transistor is coupled to the input end of the second protection circuit, a gate of the third transistor is grounded and a body and a drain of the third transistor is coupled to the second transistor; and
    a fourth transistor, wherein the fourth transistor is an NMOS transistor, a source of the fourth transistor is grounded, a gate of the fourth transistor is coupled to the input end of the second protection circuit and a body and a drain of the fourth transistor is coupled to the second transistor.

* * * * *